(12) United States Patent
Vogt

(10) Patent No.: US 10,951,168 B2
(45) Date of Patent: Mar. 16, 2021

(54) ELECTRONIC ENVELOPE DETECTION CIRCUIT AND CORRESPONDING DEMODULATOR

(71) Applicant: STMicroelectronics SA, Montrouge (FR)

(72) Inventor: Lionel Vogt, La Rochette (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 16/739,287

(22) Filed: Jan. 10, 2020

(65) Prior Publication Data
US 2020/0228061 A1    Jul. 16, 2020

(30) Foreign Application Priority Data

Jan. 14, 2019 (FR) ..................................... 1900307

(51) Int. Cl.
| | | |
|---|---|---|
| H03D 1/18 | (2006.01) | |
| H03D 1/06 | (2006.01) | |
| H03D 1/22 | (2006.01) | |
| H04L 27/06 | (2006.01) | |
| G01R 19/04 | (2006.01) | |
| H03D 3/00 | (2006.01) | |
| H04L 27/233 | (2006.01) | |
| H03F 3/20 | (2006.01) | |

(52) U.S. Cl.
CPC .............. H03D 1/18 (2013.01); G01R 19/04 (2013.01); H03D 1/06 (2013.01); H03D 1/2245 (2013.01); H03D 3/00 (2013.01); H04L 27/06 (2013.01); H04L 27/2332 (2013.01); H03F 3/20 (2013.01)

(58) Field of Classification Search
CPC .......... H03D 1/06; H03D 1/2245; H03D 3/00; H03D 1/18; H04L 27/008; H04L 27/06; H04L 27/2332; H03F 3/20; G01R 19/04
USPC ......... 329/349, 347, 353; 375/316, 320, 146
See application file for complete search history.

(56) References Cited

U.S. PATENT DOCUMENTS 8,022,754 B2 *   9/2011 Yamazaki ................ H03D 1/10
                                                        329/369
2006/0255860 A1  11/2006 Moussavi
(Continued)

FOREIGN PATENT DOCUMENTS

| EP | 2713171 A2 | 4/2014 |
|---|---|---|
| EP | 2874309 A1 | 5/2015 |
| JP | S57079715 A | 5/1982 |

OTHER PUBLICATIONS

INPI Search Report and Written Opinion for FR 1900307 dated Nov. 4, 2019 (9 pages).

*Primary Examiner* — Arnold M Kinkead
(74) *Attorney, Agent, or Firm* — Crowe & Dunlevy

(57) ABSTRACT

An electronic envelope detection circuit includes an input signal detecting circuit having at least one MOS transistor configured to receive a radiofrequency input signal and to deliver an internal signal on the basis of the input signal. The biasing point of the at least one transistor is controlled by the input signal and a control signal. A processing circuit that is coupled to the input signal detecting circuit is configured to deliver a low-frequency output signal on the basis of the internal signal and further deliver the control signal on the basis of the output signal. In operation, the value of the control signal decreases when the average power of the input signal increases, and vice versa.

29 Claims, 5 Drawing Sheets

(56) References Cited

U.S. PATENT DOCUMENTS

2008/0084956 A1 4/2008 Paraschou et al.
2017/0343589 A1 11/2017 Mukherjee et al.

* cited by examiner

ELECTRONIC ENVELOPE DETECTION CIRCUIT AND CORRESPONDING DEMODULATOR

PRIORITY CLAIM

This application claims the priority benefit of French Application for Patent No. 1900307, filed on Jan. 14, 2019, the content of which is hereby incorporated by reference in its entirety to the maximum extent allowable by law.

TECHNICAL FIELD

Embodiments relate to electronic circuits and, in particular, to electronic envelope detection circuits capable of being incorporated into radiofrequency demodulators for wireless communication applications.

BACKGROUND

In general, the purpose of an electronic envelope detection circuit, or in other words an envelope detector, is to extract a low-frequency signal from a carrier signal, for example a radiofrequency carrier signal, which is amplitude-modulated.

Envelope detectors are generally used in demodulators of the type with modulation by amplitude shift keying (ASK).

This type of demodulator is capable of processing a high data rate, for example of the order of several gigabytes per second, and of performing noncoherent demodulations while allowing low consumption. These technical features are particularly advantageous for wireless communication applications, for example short-range millimeter-wave wireless links.

A conventional envelope detector may, for example, be based on the nonlinearity of an electronic device, and may comprise an amplifier in a common-source configuration.

However, the amplifier of such an envelope detector requires a precise biasing point so as to maximize the conversion gain, and has a fairly limited dynamic range.

This biasing point is important so that the average power of a radiofrequency input signal of the envelope detector does not exceed the dynamic range of the envelope detector, this being in order to extract a low-frequency signal with a sufficient aptitude without clipping.

In practice, it is difficult or impracticable to configure such a precise biasing point of the amplifier on a one-off basis because of possible variations in the average power of the radiofrequency input signal of the envelope detector, in the method for manufacturing the envelope detector, or in the temperature in proximity to the envelope detector.

There are also conventional technical solutions which propose a feedback circuit configured in order to adapt the variation of an output signal of the envelope detector in terms of direct current (DC) as a function of the average power of the radiofrequency input signal of the envelope detector.

However, such a feedback circuit is generally complex. Furthermore, the biasing point of the envelope detector configured to receive the radiofrequency input signal is not variable, and is often poorly suited to the input signal because of the short-channel effect of the transistor of the amplifier.

Consequently, the conversion gain, in other words the sensitivity, and the dynamic range of the envelope detector cannot be maximized. During a variation in the average power of the radiofrequency input signal, this often results in distortion of the output signal of the envelope detector.

There is thus a need to provide a technical solution with low complexity, with low energy consumption, and with a low silicon footprint, making it possible to adapt the biasing point and the conversion gain of an envelope detector dynamically as a function of the average power of the input signal of the envelope detector, so as to extend the dynamic range of the envelope detector.

SUMMARY

According to one aspect, an electronic envelope detection circuit is provided.

This electronic envelope detection circuit comprises: an input signal detecting circuit having at least one MOS transistor configured to receive a radiofrequency input signal and to deliver an internal signal on the basis of the input signal, the biasing point of the at least one transistor being configured to be controlled by the input signal and a control signal; and a processing circuit coupled to the input signal detecting circuit and configured to deliver a low-frequency output signal on the basis of the internal signal and to deliver the control signal on the basis of the output signal, so that the value of the control signal decreases when the average power of the input signal increases, and vice versa.

Advantageously, such a circuit allows, as a function of the variation in the average power of the input signal, dynamical regulation of the biasing point of the at least one transistor of the input signal detecting circuit so as to adapt the biasing point of the at least one transistor to the average power of the radiofrequency input signal.

As a result of this, the conversion gain of the electronic envelope detection circuit is dynamically adapted to the variation in the average power of the input signal.

In other words, when the average power of the input signal increases, the value of the at least one control signal will decrease so as to compensate for the variation in the average power of the input signal. Consequently, the biasing point is more or less adapted and influenced little by the variation.

Thus, the electronic envelope detection circuit can adapt dynamically to the variation in the average power of the input signal, and the dynamic range of the electronic envelope detection circuit is extended.

According to one embodiment, the input signal detecting circuit comprises: a first N-type MOS transistor and a second N-type MOS transistor, the drains of which are jointly coupled to the processing circuit; and a transformer comprising an input winding configured to receive the input signal, a first output winding coupled to the processing circuit and to the gates of the first and second transistors, and a second output winding coupled to the sources of the first and second transistors, the first input winding being configured to receive a control signal.

Specifically, the first and second transformers form a mixer configured to receive the input signal on the gates and on the sources so as to multiply the input signal by itself and thus, by raising it to the second power, to implement envelope detection. The gates of the first and second transistors are configured to be controlled by the input signal and the control signal by the first output winding.

The first output winding may, for example, comprise a first central node located in the middle of the first output winding and configured to receive the control signal.

The second output winding may, for example, comprise a second central node located in the middle of the second output winding and coupled to ground.

The use of such a three-way transformer advantageously makes it possible to apply the radiofrequency input signal and the control signal to the gates and sources of the first and second transistors so as to control the biasing point of the first and second transistors and to obtain a higher conversion efficiency of the input signal detecting circuit.

The number of turns of the first output winding may, for example, be greater than the number of turns of the input winding and greater than the number of turns of the second output winding, which advantageously makes it possible to increase the sensitivity of the input signal detecting circuit.

According to another embodiment, the input signal detecting circuit comprises: an N-type MOS transistor, the drain of which is coupled to the processing circuit; and a transformer comprising an input winding configured to receive the input signal and coupled between the source of the N-type MOS transistor and ground, and an output winding coupled between the gate of the N-type MOS transistor and the processing circuit and configured to receive the control signal.

Such an input signal detecting circuit makes it possible to receive the input signal through a single input (single-ended mode).

According to yet another embodiment, the input signal detecting circuit comprises a first N-type MOS transistor and a second N-type MOS transistor, the drains of which are jointly coupled to the processing circuit, the sources of which are jointly coupled to ground, and the gates of which are configured to receive the control signal, the gates of the first and second N-type MOS transistors being furthermore configured to receive the input signal in differential mode.

By way of indication but without limitation, the processing circuit may, for example, comprise a transimpedance amplifier configured to receive the internal signal.

The frequency of the radiofrequency input signal may, for example, be of the order of 60 GHz.

According to another aspect, a demodulator incorporating an electronic envelope detection circuit as defined above is provided.

By way of non-limiting example, the demodulator may, for example, be a demodulator of the type with modulation by amplitude shift keying.

According to another aspect, a wireless radiofrequency receiver comprising a demodulator as defined above is provided.

According to yet another aspect, a wireless communication apparatus comprising a radiofrequency receiver as defined above is provided.

BRIEF DESCRIPTION OF THE DRAWINGS

Other advantages and features of the invention will become apparent on studying the detailed description of entirely non-limiting embodiments and the appended drawings, in which.

DETAILED DESCRIPTION

Figure 1:
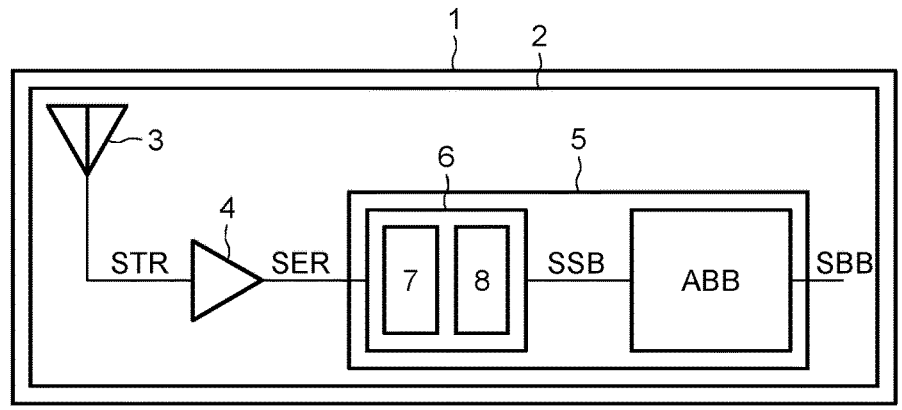
FIG. 1 schematically illustrates a wireless communication apparatus.

FIG. 1 illustrates a wireless communication apparatus 1, in this case for example based on the technology of short-range millimeter-wave wireless links.

This apparatus 1 is configured in order to carry out wireless communications at a high rate, for example several gigabits per second, over a short range, for example of the order of 10 centimeters, so as to replace data communications via cables, for example of the universal serial bus (USB) type.

Without a mechanical alignment constraint, the apparatus 1 may advantageously be used for industrial or consumer devices which have small dimensions and/or are sealed.

The apparatus 1 comprises a wireless radio receiver 2 having: an antenna 3 receiving a radiofrequency transmission signal STR, a low-noise amplifier 4 coupled to the antenna 3 and configured in order to shape the radiofrequency transmission signal STR so as to deliver a radiofrequency input signal SER, and a demodulator 5, in this case for example of the type with modulation by amplitude shift keying (ASK), more particularly of the type with modulation by on-off keying (OOK), configured in order to deliver a baseband signal SBB on the basis of the input signal SER.

The demodulator 5 comprises an electronic envelope detection circuit 6 and a baseband amplifier ABB.

The electronic envelope detection circuit 6 is configured to receive the input signal SER and is configured in order to deliver a low-frequency output signal SSB to the baseband amplifier ABB.

The baseband amplifier is configured in order to subsequently amplify the low-frequency output signal SSB so as to generate the output signal SBB.

Figure 2:
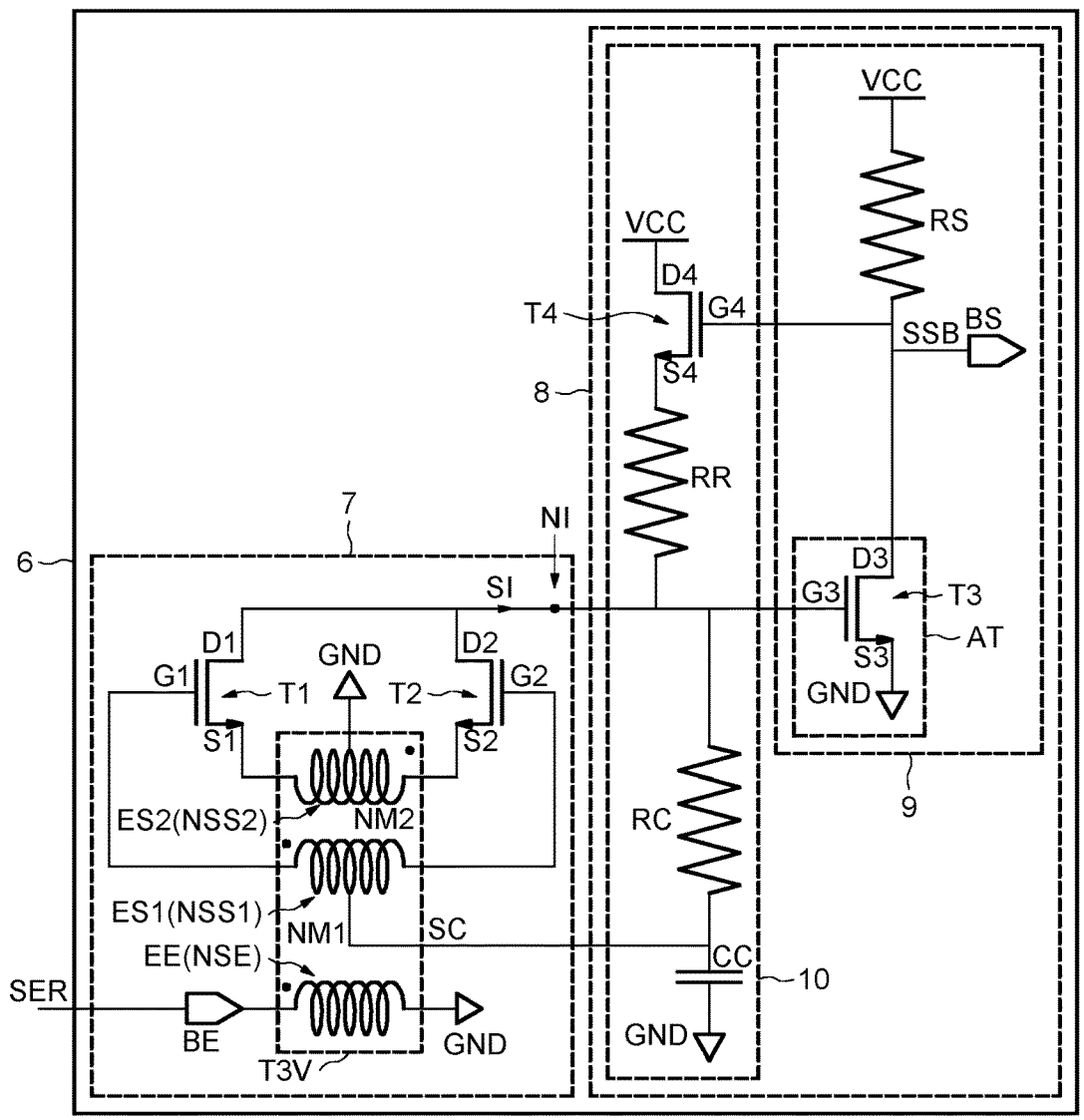
FIG. 2 schematically illustrates a preferred embodiment of an electronic envelope detection circuit, FIGS. 3A-3C schematically illustrate a result of simulation of the electronic envelope detection circuit, FIG. 4 schematically illustrates a result of simulation of the electronic envelope detection circuit, FIG. 5 schematically illustrates another embodiment of the electronic envelope detection circuit, FIG. 6 schematically illustrates another embodiment of the electronic envelope detection circuit.

Reference is made to FIG. 2 in order to illustrate in more detail a preferred exemplary embodiment of the electronic envelope detection circuit 6 comprising an input signal detecting circuit 7 and a processing circuit 8.

The input signal detecting circuit 7 comprises: a differential pair comprising a first N-type MOS transistor T1 and a second N-type MOS transistor T2, and a three-way transformer T3V coupled to the differential pair.

The transformer T3V comprises: an input winding EE coupled between a reference voltage node such as ground GND and an input terminal BE configured to receive the radiofrequency input signal SER, a first winding ES1 coupled between the gates G1, G2 of the first and second transistors T1, T2, and a second output winding ES2 coupled between the sources S1, S2 of the first and second transistors T1, T2.

It should be noted that the radiofrequency input signal SER may also be applied differentially to the terminals of the input winding EE.

The first output winding ES1 comprises a first central node NM1 located in the middle of the first output winding ES1 and coupled to the processing circuit 8. The first central node NM1 is configured to receive a control signal SC delivered by the processing circuit 8.

The first output winding ES1 is configured in order to deliver a differential gate voltage to the gates G1, G2 of the first and second transistors T1, T2 on the basis of the input signal SER and of the control signal SC.

In other words, the biasing point of the first and second transistors T1, T2 is controlled by the input signal SER and the control signal SC.

As will be seen in more detail below, the control signal SC is a voltage signal configured to adjust the average power, in common mode, of the radiofrequency input signal SER.

The second output winding ES2 comprises a second central node NM2 located in the middle of the second output winding ES2 and coupled to a reference voltage node such as ground GND.

The second output winding ES2 is configured in order to deliver a differential source voltage to the sources S1, S2 of the first and second transistors T1, T2 on the basis of the input signal SER.

It should be noted that the directions of the turns of the input winding EE and of the first output winding ES1 are the same, whereas the direction of the turns of the second output winding ES2 is opposite to that of the input winding EE and of the first output winding ES1.

By way of non-limiting example, the number of turns NSS1 of the first output winding ES1 is greater than the number of turns NSE of the input winding EE and greater than the number of turns NSS2 of the second output winding ES2, so as to increase the sensitivity of the input signal detecting circuit 7.

The input signal detecting circuit 7 further comprises an intermediate node NI coupled to the drains D1, D2 of the first and second transistors T1, T2, and the input signal detecting circuit 7 is configured in order to output to the intermediate node NI an internal current signal SI which is a combination of the drain currents of the first and second transistors T1, T2.

The processing circuit 8 comprises an output module 9 and a feedback module 10.

The output module 9 comprises a transimpedance amplifier AT well known to a person skilled in the art.

The transimpedance amplifier AT in this case comprises, for example, a third N-type MOS transistor T3, the gate G3 of which is coupled to the intermediate node NI, the source S3 of which is coupled to a reference voltage node such as ground GND, and the drain D3 of which is coupled to an output terminal BS, and an output resistor RS coupled between a supply voltage VCC and the output terminal BS.

The size of the third transistor T3 is expediently selected in order to be adapted to those of the first and second transistors T1 and T2, so as to ensure that the gate voltage VG3 of the third transistor T3 is adapted to make the first and second transistors T1 and T2 operate.

The drain current of the third transistor T3 is approximately proportional to the internal signal SI. The output module 9 is configured in order to convert the drain current into the low-frequency output voltage signal SSB at the output terminal BS by means of the output resistor RS.

In other words, the transimpedance amplifier AT is configured in order to deliver the low-frequency output voltage signal SSB to the output terminal BS on the basis of the internal current signal SI.

The feedback module 10 comprises: a fourth N-type MOS transistor T4, the gate G4 of which is coupled to the output terminal BS, the drain D4 of which is coupled to the supply voltage VCC, and the source S4 of which is coupled to the intermediate node NI via a feedback resistor RR, a control resistor RC coupled between the intermediate node NI and the first central node NM1, and a control capacitor CC coupled between the first central node NM1 and a reference voltage node such as ground GND.

Figure 3A:
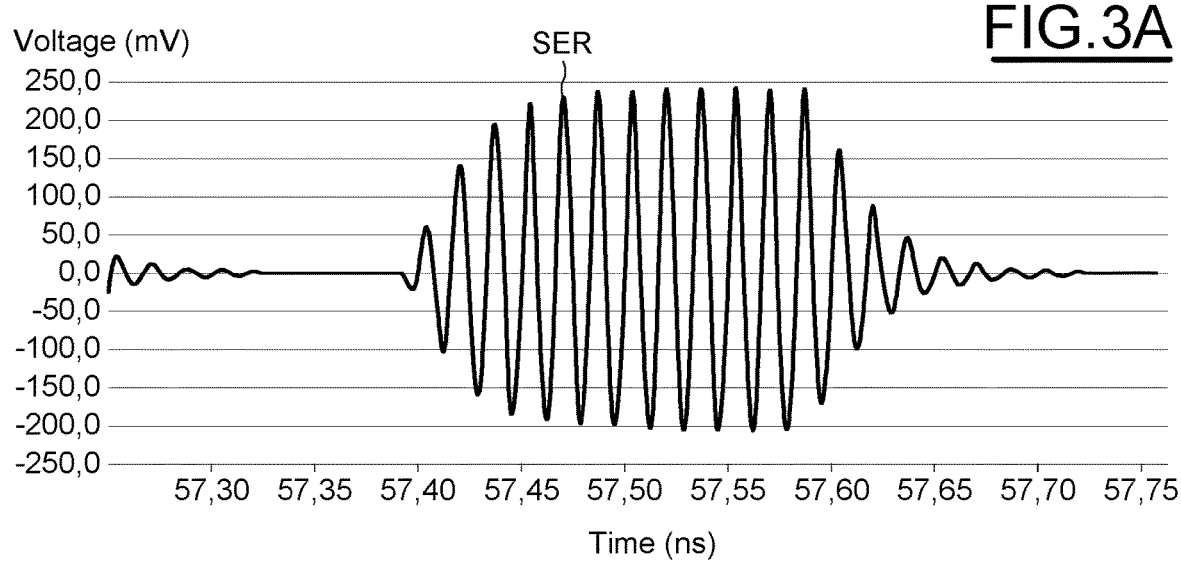
Figure 3B:
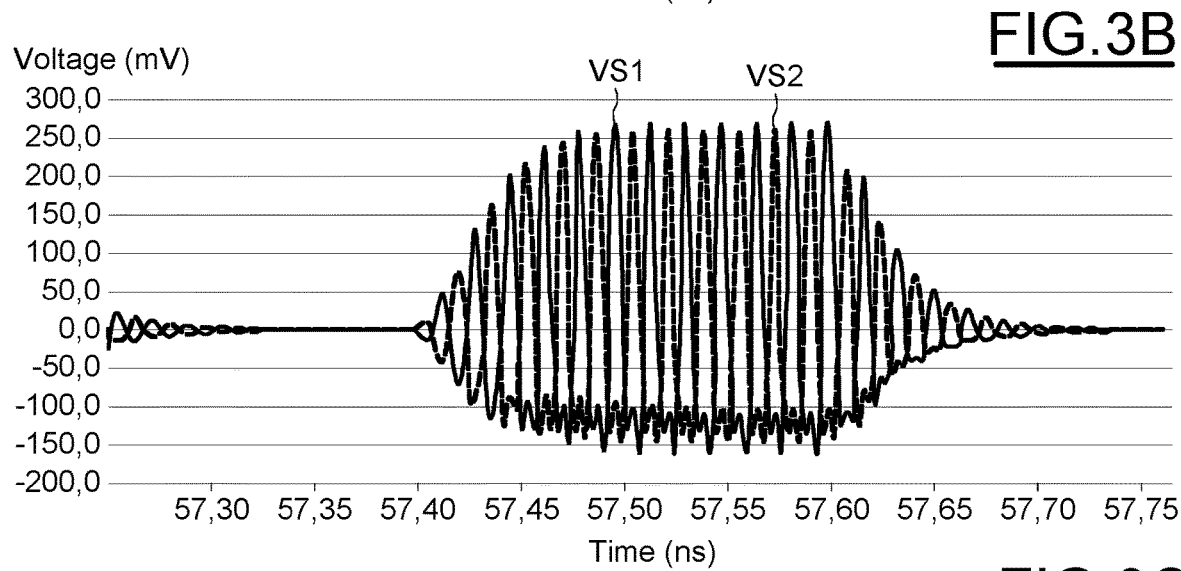
Figure 3C:
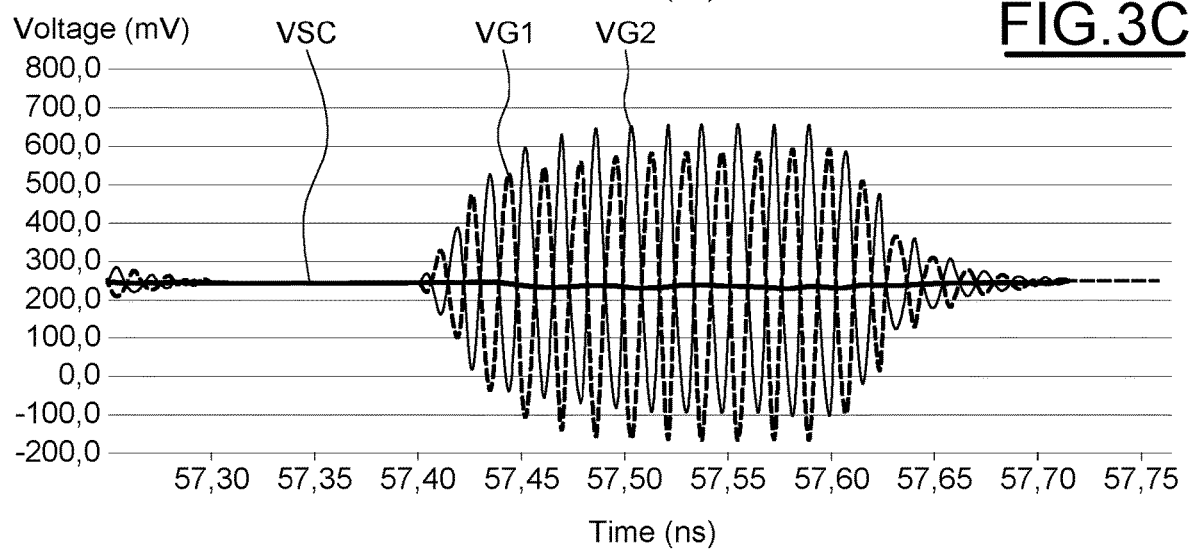

Reference is now made to FIGS. 3A-3C in order to schematically illustrate an example of simulation of the operation of the electronic envelope detection circuit 6.

An example of an input voltage signal SER can be seen in FIG. 3A. The frequency of the carrier of the input signal SER is in this case for example 60 GHz, and the input signal SER is modulated with a 5 Gb/s bitstream in amplitude shift keying (ASK).

The source voltages VS1, VS2 of the first and second transistors T1, T2 are illustrated in FIG. 3B.

Since the numbers of turns NSE, NSS2 of the input winding EE and of the second output winding ES2 are the same, and the directions of the input winding EE and of the second output winding ES2 are opposite, the amplitude of the source voltage VS2 of the second transistor T2 is substantially the same as that of the input signal SER, whereas the amplitude of the source voltage VS1 of the first transistor T1 is substantially opposite to that of the input signal SER.

In the same way, since the number of turns NSS1 of the first output winding ES1 is greater than that of the input winding EE and the directions of the input winding EE and of the first output winding ES1 are the same, the amplitude of the gate voltage VG1 of the first transistor T1 is greater than that of the input signal SER, whereas the amplitude of the gate voltage VG2 of the second transistor T2 is substantially opposite to that of the first transistor T1. This is shown in FIG. 3C.

It may also be noted that the value VSC of the control signal SC in FIG. 3C corresponds to the average of the gate voltages VG1, VG2 of the first and second transistors T1, T2.

When the average power of the input signal SER increases, the value of the internal signal SI and the average value of the low-frequency output signal SSB will increase, whereas the value VSC of the control signal SC will decrease so as to lower the biasing point of the input signal detecting circuit. As a result of this, the dynamic range of the input signal detecting circuit is extended.

Conversely, when the average power of the input signal SER decreases, the value of the internal signal SI and the value of the low-frequency output signal SSB will also decrease, whereas the value VSC of the control signal SC will increase so as to compensate for the variation in the average power of the input signal SER.

Figure 4:
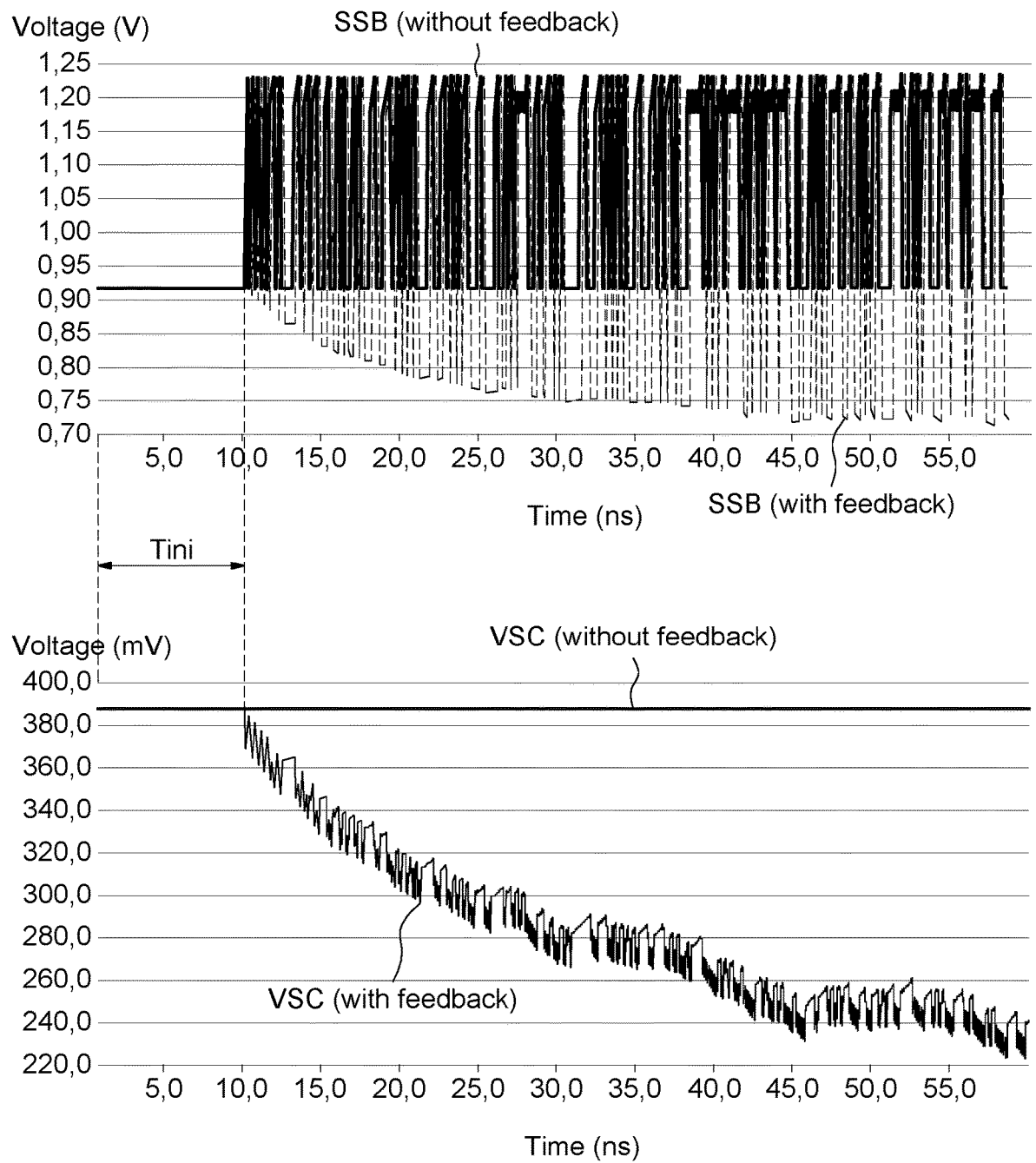

Reference is now made to FIG. 4 in order to schematically illustrate another example of simulation of the electronic envelope detection circuit 6.

During an initial period Tini, the value of the output signal SSB is constant (DC value) because that of the input signal SER is zero.

The average power of the input signal SER is subsequently increased so as to increase the values of the drain currents of the first and second transistors T1, T2. The value of the internal signal SI is consequently increased.

The output module 9 is configured in order to generate the output voltage signal SSB on the basis of the internal signal SI.

The value of the output signal SSB is therefore also increased so as to increase the value of the source current of the fourth transistor T4.

By way of indication, the value of the output signal SSB is in this case saturated because the amplitude of the input signal SER is already too great.

Since the gain of the transimpedance amplifier is limited, in this case for example by the values of the feedback resistor RR and the dimensions of the MOS transistor T4 as well as by the open-loop gain given by the third transistor T3 and the output resistor RS, the average gate voltage VG3 of the third transistor T3 and the value VSC of the control signal SC will consequently decrease, and will do so commensurately more when the output BS of the output module 9 approaches saturation, the effect of which is to reduce the open-loop gain formed by the third transistor T3 and the output resistor RS.

As indicated above, the value VSC of the control signal SC corresponds to the average of the gate voltages VG1, VG2 of the first and second transistors T1, T2.

The decrease in the value VSC of the control signal SC leads to the decrease in the average of the gate voltages VG1, VG2 of the first and second transistors T1, T2.

In other words, the biasing point of the input signal detecting circuit is reduced as it follows the variation in the value VSC of the control signal SC.

FIG. 4 also shows another example of the value VSC of the control signal SC in a case in which the electronic envelope detection circuit 6 operates without the feedback module 10.

In this example, the range of variation of the output signal SSB is extended, and the value of the output signal SSB oscillates around its DC value, which advantageously permits a better demodulation quality, in particular in order to reproduce a binary signal, by comparing the output signal SSB with a threshold close to its DC value, and reduced distortion in the low-frequency output signal SSB. Such distortion may degrade the jitter of the demodulated binary signal.

Figure 5:
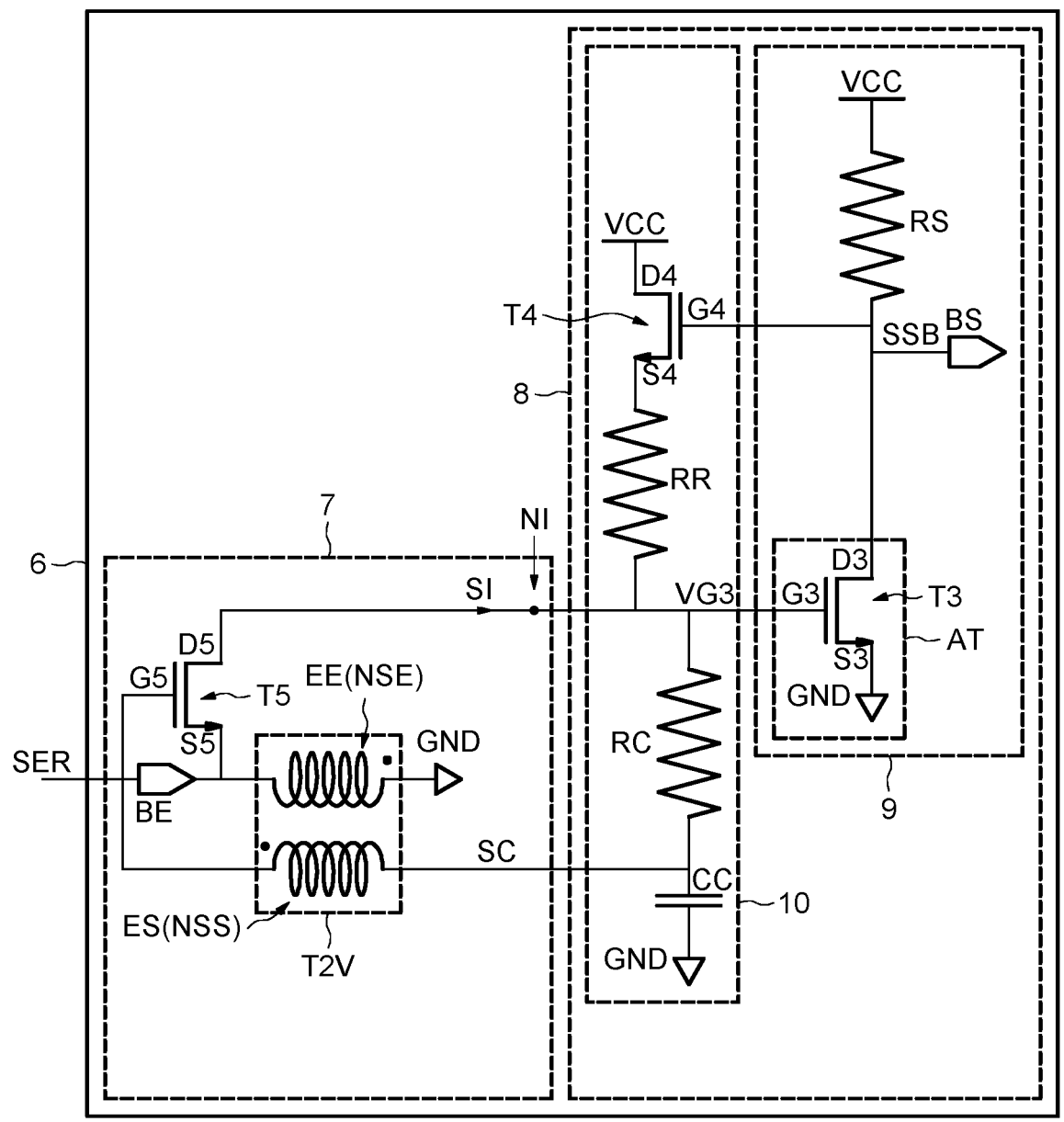

As a variant, FIG. 5 illustrates another exemplary embodiment of the electronic envelope detection circuit 6.

By way of indication, this electronic envelope detection circuit 6 may, for example, have the same processing circuit 8 as illustrated in FIG. 2.

The input signal detecting circuit 7 of this electronic envelope detection circuit 6 comprises a fifth N-type MOS transistor T5, the drain D5 of which is coupled to the intermediate node NI connected to the gate G3 of the third transistor T3, the source S5 of which is coupled to a reference voltage node such as ground via an input winding EE of a two-way transformer T2V, and the gate G5 of which is coupled to the feedback module 10 via an output winding ES of the transformer T2V.

The input signal detecting circuit 7 receives the radiofrequency input signal SER at the source S5 of the fifth transistor T5.

The direction of turns of the input winding EE is opposite to that of turns of the output winding ES. The number of turns NSE of the input winding EE is, for example, less than the number of turns NSS of the output winding ES, so as to improve the sensitivity of the input signal detecting circuit 7.

As a result of this, the gate voltage VG5 of the fifth transistor T5 is controlled by the input signal SER.

The output winding ES is also configured to receive the control signal SC delivered by the processing circuit 8.

In other words, the gate voltage VG5 of the fifth transistor T5 is also controlled by the control signal SC. The biasing point of the fifth transistor T5 is consequently controlled by the input signal SER and by the control signal SC.

When the average power of the input signal SER increases, the drain current of the fifth transistor T5, in other words the internal signal SI, also increases.

In that case, the processing circuit 8 is configured in order to increase the value of the output signal SSB and decrease the value of the control signal SC, so as to reduce the average of the gate voltage VG5 of the fifth transistor T5.

Thus, the electronic envelope detection circuit 6 is capable of adapting to the variation in the average power of the input signal SER so as to dynamically modify the biasing point and the conversion gain of the input signal detecting circuit 7. The dynamic range of the circuit 6 is therefore likewise extended.

Figure 6:
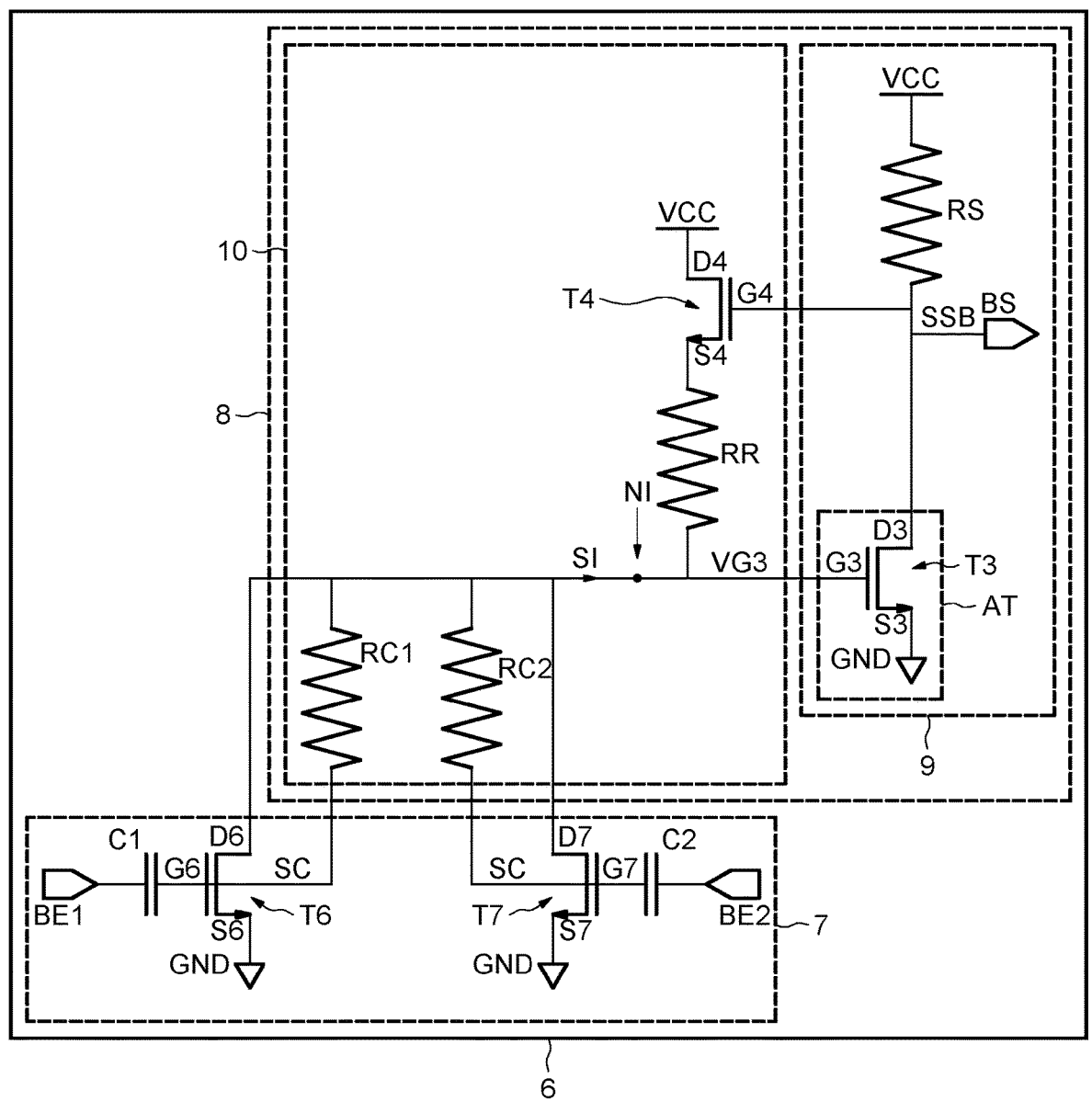

Reference is now made to FIG. 6 in order to illustrate another exemplary embodiment of the electronic envelope detection circuit 6.

The processing circuit 8 is similar to that illustrated in FIGS. 2 and 5, and the input signal detecting circuit 7 comprises a sixth N-type MOS transistor T6 and a seventh N-type MOS transistor T7.

The drains of the sixth and seventh transistors T6, T7 are jointly coupled to the intermediate node NI so as to deliver the internal signal SI to the intermediate node NI. The sources of the sixth and seventh transistors T6, T7 are coupled to a reference voltage node such as ground GND.

The gate G6 of the sixth transistor T6 is coupled to the intermediate node NI via a first control resistor RC1, and the gate G6 of the sixth transistor T6 is further coupled to a first input terminal BE1 via a first capacitor C1.

Likewise, the gate G7 of the seventh transistor T7 is coupled to the intermediate node N1 via a second control resistor RC2. The gate G7 of the seventh transistor T7 is further coupled to a second input terminal BE2 via a second capacitor C2.

The first and second control resistors RC1, RC2 are identical, and the gates G6, G7 of the sixth and seventh transistors T6, T7 are configured to receive the same control signal SC.

The input signal detecting circuit 7 is configured in order to receive the radiofrequency input signal SER in differential mode via the first and second capacitors C1, C2 and the input terminals BE1, BE2.

If the average power of the input signal SER decreases, the internal signal SI also decreases.

The output module 9 is configured in order to convert the internal signal SI into an output signal SSB, and the value of the output signal SSB also decreases, which leads to an increase in the gate voltage VG3 of the third transistor T3.

The value of the control signal SC is consequently increased so as to modify the biasing point of the detection circuit 6.

In the same way, an increase in the average power of the radiofrequency input signal SER leads to a decrease in the value of the control signal SC.

Thus, an electronic envelope detection circuit is obtained which is capable of adapting the biasing point and the conversion gain of the circuit dynamically to the variation in the average power of the input signal of the electronic envelope detection circuit, so as to extend its dynamic range.

The invention claimed is:

1. An electronic envelope detection circuit, comprising:
    an input signal detecting circuit comprising a first MOS transistor and a second MOS transistor having gates configured to receive a radiofrequency input signal, wherein drains of the first and second MOS transistors are jointly coupled to output an internal signal in response to said radiofrequency input signal, wherein the first and second MOS transistors have a biasing point, and wherein the biasing point is controlled by the radiofrequency input signal and a control signal;
    a processing circuit having an input configured to receive the internal signal and configured to generate a low-frequency output signal in response to the internal signal, wherein the processing circuit is further configured to generate the control signal in response to the low-frequency output signal;

wherein a value of the control signal decreases in response to an increase in an average power of the radiofrequency input signal, and vice versa; and a transformer comprising an input winding configured to receive the radiofrequency input signal, a first output winding coupled to receive the control signal and further coupled to gates of the first and second MOS transistors, and a second output winding coupled to sources of the first and second MOS transistors.

2. The circuit according to claim 1, wherein the first output winding comprises a first central node located in a middle of the first output winding and configured to receive the control signal, and the second output winding comprises a second central node located in a middle of the second output winding and coupled to a reference supply node.

3. The circuit according to claim 1, wherein a number of turns of the first output winding is greater than a number of turns of the input winding and greater than a number of turns of the second output winding.

4. The circuit according to claim 1, wherein the processing circuit comprises:
an output transistor having a control terminal coupled to receive the internal signal and a drain configured to output the low-frequency output signal; and
a resistor-capacitor circuit comprising a resistor and capacitor coupled in series between the control terminal and a reference supply node, said resistor-capacitor circuit configured to generate the control signal.

5. The circuit according to claim 4, further comprising a feedback transistor having a control terminal configured to receive the low-frequency output signal and a drain coupled to the control terminal of the output transistor through a resistor circuit.

6. An electronic envelope detection circuit, comprising:
an input signal detecting circuit comprising a MOS transistor having a gate configured to receive a radiofrequency input signal and a drain coupled to output an internal signal in response to the radiofrequency input signal, wherein the MOS transistor has a biasing point, and wherein the biasing point is controlled by the radiofrequency input signal and a control signal;
a processing circuit having an input configured to receive the internal signal and configured to generate a low-frequency output signal in response to the internal signal, wherein the processing circuit is further configured to generate the control signal in response to the low-frequency output signal;
wherein a value of the control signal decreases in response to an increase in an average power of the input signal, and vice versa; and
a transformer comprising an input winding configured to receive the radiofrequency input signal and coupled between a source of the MOS transistor and a reference voltage node, and an output winding coupled between the gate of the MOS transistor and the processing circuit and configured to receive the control signal.

7. The circuit according to claim 6, wherein the processing circuit comprises:
an output transistor having a control terminal coupled to receive the internal signal and a drain configured to output the low-frequency output signal; and
a resistor-capacitor circuit comprising a resistor and capacitor coupled in series between the control terminal and a reference supply node, said resistor-capacitor circuit configured to generate the control signal.

8. The circuit according to claim 7, further comprising a feedback transistor having a control terminal configured to receive the low-frequency output signal and a drain coupled to the control terminal of the output transistor through a resistor circuit.

9. An electronic envelope detection circuit, comprising:
an input signal detecting circuit comprising a first MOS transistor and a second MOS transistor having gates configured to receive a radiofrequency input signal in differential mode, wherein drains of the first and second MOS transistors are jointly coupled to output an internal signal in response to said radiofrequency input signal, wherein the first and second MOS transistors have a biasing point, wherein the biasing point is controlled by the radiofrequency input signal and a control signal, wherein sources of the first and second MOS transistors are jointly coupled to a reference voltage node, and wherein gates of the first and second MOS transistors are further coupled to receive the control signal; and
a processing circuit having an input configured to receive the internal signal generated by the input signal detecting circuit and configured to generate a low-frequency output signal in response to the internal signal, wherein the processing circuit is further configured to generate the control signal in response to the low-frequency output signal;
wherein a value of the control signal decreases in response to an increase in an average power of the input signal, and vice versa.

10. The circuit according to claim 9, wherein the processing circuit comprises:
an output transistor having a control terminal coupled to receive the internal signal and a drain configured to output the low-frequency output signal; and
a resistor circuit comprising a first resistor coupled between the control terminal and the gate of the first MOS transistor to provide said control signal and a second resistor coupled between the control terminal and the gate of the second MOS transistor to provide said control signal.

11. The circuit according to claim 10, further comprising a feedback transistor having a control terminal configured to receive the low-frequency output signal and a drain coupled to the control terminal of the output transistor through a resistor circuit.

12. The circuit according to claim 9, wherein the processing circuit comprises a transimpedance amplifier configured to receive the internal signal.

13. The circuit according to claim 9, wherein the frequency of the radiofrequency input signal is of the order of 60 GHz.

14. The circuit according to claim 9, wherein the electronic envelope detection circuit is a component of a demodulator.

15. The circuit according to claim 14, wherein the demodulator of the type with modulation by amplitude shift keying.

16. The circuit according to claim 14, wherein the demodulator is a component of a wireless radiofrequency receiver.

17. The circuit according to claim 16, wherein the wireless radiofrequency receiver is a component of a wireless communication apparatus.

18. The circuit according to claim 1, wherein the processing circuit comprises a transimpedance amplifier configured to receive the internal signal.

19. The circuit according to claim 1, wherein the frequency of the radiofrequency input signal is of the order of 60 GHz.

20. The circuit according to claim 1, wherein the electronic envelope detection circuit is a component of a demodulator.

21. The circuit according to claim 20, wherein the demodulator of the type with modulation by amplitude shift keying.

22. The circuit according to claim 20, wherein the demodulator is a component of a wireless radiofrequency receiver.

23. The circuit according to claim 22, wherein the wireless radiofrequency receiver is a component of a wireless communication apparatus.

24. The circuit according to claim 6, wherein the processing circuit comprises a transimpedance amplifier configured to receive the internal signal.

25. The circuit according to claim 6, wherein the frequency of the radiofrequency input signal is of the order of 60 GHz.

26. The circuit according to claim 6, wherein the electronic envelope detection circuit is a component of a demodulator.

27. The circuit according to claim 26, wherein the demodulator of the type with modulation by amplitude shift keying.

28. The circuit according to claim 26, wherein the demodulator is a component of a wireless radiofrequency receiver.

29. The circuit according to claim 28, wherein the wireless radiofrequency receiver is a component of a wireless communication apparatus.

* * * * *